United States Patent
Akimoto (10) Patent No.: US 7,692,760 B2
(45) Date of Patent: Apr. 6, 2010

(54) LIQUID IMMERSION EXPOSURE APPARATUS, METHOD OF CONTROLLING THE SAME, AND DEVICE MANUFACTURING METHOD

(75) Inventor: Satoshi Akimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/196,348

(22) Filed: Aug. 4, 2005

(65) Prior Publication Data
US 2006/0028630 A1  Feb. 9, 2006

(30) Foreign Application Priority Data
Aug. 5, 2004  (JP)  ............. 2004-229812

(51) Int. Cl.
*G03B 27/52* (2006.01)
(52) U.S. Cl. ........................................... 355/30
(58) Field of Classification Search ............ 355/53, 355/30, 72–76, 55; 359/665
See application file for complete search history.

(56) References Cited

U.S. PATENT DOCUMENTS

| | | | | |
|---|---|---|---|---|
| 5,153,807 | A | 10/1992 | Saito et al. | 364/165 |
| 5,663,783 | A | 9/1997 | Ueda | 355/53 |
| 6,567,154 | B2 | 5/2003 | Akimoto | 355/53 |
| 6,704,093 | B2 | 3/2004 | Kurosawa | 355/53 |
| 6,937,317 | B2 | 8/2005 | Morisada | 355/53 |
| 2002/0039845 | A1 | 4/2002 | Yoshimura | 438/784 |
| 2003/0197845 | A1 | 10/2003 | Morisada | 355/53 |
| 2004/0263808 | A1* | 12/2004 | Sewell | 355/30 |
| 2005/0007569 | A1* | 1/2005 | Streefkerk et al. | 355/53 |
| 2005/0018156 | A1 | 1/2005 | Mulkens et al. | 355/30 |
| 2005/0046813 | A1* | 3/2005 | Streefkerk et al. | 355/30 |
| 2005/0052642 | A1* | 3/2005 | Shibata et al. | 356/237.1 |
| 2005/0217956 | A1 | 10/2005 | Morisada | 188/378 |
| 2005/0219481 | A1 | 10/2005 | Cox et al. | 355/18 |
| 2005/0219488 | A1 | 10/2005 | Nei et al. | 355/53 |
| 2005/0237504 | A1 | 10/2005 | Nagasaka et al. | 355/53 |
| 2005/0259234 | A1 | 11/2005 | Hirukawa et al. | 355/53 |
| 2006/0098177 | A1 | 5/2006 | Nagasaka | 355/53 |
| 2006/0098178 | A1 | 5/2006 | Nagasaka et al. | 355/53 |

(Continued)

FOREIGN PATENT DOCUMENTS

EP  0 360 206 A2  3/1990

(Continued)

OTHER PUBLICATIONS

Japanese Office Action dated Jul. 7, 2006, issued in corresponding Japanese patent application No. 2004-229812.

(Continued)

*Primary Examiner*—Peter B Kim
*Assistant Examiner*—Chia-how Michael Liu
(74) *Attorney, Agent, or Firm*—Fitzpatrick, Cella, Harper & Scinto (57) ABSTRACT

A liquid immersion exposure apparatus including a stage which carries a substrate, a projection lens unit which projects a pattern onto the substrate, a unit which supplies liquid to a space between the substrate and the projection lens unit and recovers the liquid from the space, and a controller which controls driving of the stage. The controller changes a driving profile of the stage according to a liquid immersion condition.

16 Claims, 8 Drawing Sheets

U.S. PATENT DOCUMENTS

| | | | |
|---|---|---|---|
| 2006/0119820 A1 | 6/2006 | Hirukawa | 355/53 |
| 2006/0132736 A1 | 6/2006 | Nagasaka et al. | 355/53 |
| 2006/0132737 A1 | 6/2006 | Magome et al. | 355/53 |
| 2006/0139593 A1 | 6/2006 | Nagasaka et al. | 355/53 |
| 2006/0146305 A1 | 7/2006 | Magome et al. | 355/53 |

FOREIGN PATENT DOCUMENTS

| | | |
|---|---|---|
| EP | 1 494 074 A1 | 1/2005 |
| EP | 1 582 929 A1 | 10/2005 |
| EP | 1 632 991 A1 | 3/2006 |
| EP | 1 653 501 A1 | 5/2006 |
| EP | 1 662 554 A1 | 5/2006 |
| JP | 6-124873 | 5/1994 |
| JP | 07-142337 | 6/1995 |
| JP | 09-027447 | 1/1997 |
| JP | 10-303114 | 11/1998 |
| JP | 2002-25886 | 1/2002 |
| JP | 2002-184687 | 6/2002 |
| JP | 2002-246304 | 8/2002 |
| JP | 2003-133216 | 5/2003 |
| JP | 2003-314610 | 11/2003 |
| JP | 2004-186180 | 7/2004 |
| JP | 2004-207711 | 7/2004 |
| JP | 2005-79480 | 3/2005 |
| JP | 2005-294846 | 10/2005 |
| WO | WO 99/49504 | 9/1999 |
| WO | WO 2004/053953 A1 | 6/2004 |
| WO | WO 2004/053955 A1 | 6/2004 |
| WO | WO 2004/053956 A2 | 6/2004 |
| WO | WO 2005/078777 A1 | 8/2005 |

OTHER PUBLICATIONS

European Search Report dated Oct. 2, 2006, Issued in corresponding European patent application No. EP 05 01 7010, forwarded in a Communication dated Oct. 20, 2006.

* cited by examiner

FIG. 8

LIQUID IMMERSION EXPOSURE APPARATUS, METHOD OF CONTROLLING THE SAME, AND DEVICE MANUFACTURING METHOD

FIELD OF THE INVENTION

The present invention relates to a liquid immersion exposure technique for exposing an original pattern onto a substrate while a space on the substrate is filled with a liquid.

BACKGROUND OF THE INVENTION

Semiconductor devices have become finer, and exposure light sources have shifted from g lines and i lines of conventional high-pressure mercury lamps to KrF and ArF lasers, which are called excimer lasers, having shorter wavelengths. Further, the use of an $F_2$ laser, an electron beam, and X-rays has been examined.

Moreover, it is necessary to increase the NA (numerical aperture) of a projection lens to achieve a higher resolving power, thereby reducing a depth of focus. As is generally known, these relationships can be expressed by the equations below:

(Resolving power)=$k1(\lambda/NA)$ (Depth of focus)=$\pm k2\lambda/NA^2$ where $\lambda$ represents the wavelength of a light source used for exposure, NA represents the NA (numerical aperture) of the projection lens, and k1 and k2 represent coefficients associated with a process.

Meanwhile, a high resolving power and a high depth of focus are obtained by a phase shift mask, deformed illumination, and the like. However, methods using an $F_2$ laser, an electron beam, and X-rays increase the cost of an apparatus. The phase shift mask or the deformed illumination, and the like, does not produce any effects in some circuit patterns.

Hence, attempts have been made to use a liquid immersion method, in which a projection exposure apparatus is provided with a nozzle having a liquid inlet surrounding the end of a projection lens (the closest lens to a wafer), a liquid is supplied through the inlet, the liquid is held between the projection lens and the wafer, and exposure is performed (see, for example, Japanese Patent Laid-Open No. 6-124873, the pamphlet of International Publication WO 99/049504, and Japanese Patent Laid-Open No. 10-303114).

Under the effect of liquid immersion, the above resolving power and depth of focus are represented by the equations below:

(Resolving power)=$k1(\lambda0/n)/NA0$ (Depth of focus)=$\pm k2(\lambda0/n)/(NA0)^2$ where $\lambda0$ represents the wavelength of exposure light in the air, n represents an index of refraction of a liquid used for liquid immersion, a represents the half angle of convergence of a light beam, and NA0=sin $\alpha$ is established.

That is, the effect of liquid immersion is the same as the use of exposure light having a wavelength of 1/n. In other words, in the case of a projection optical system design having the same NA, liquid immersion can increase the depth of focus by n times. For example, when water is used as a liquid, n=1.33 is obtained, which means that the depth of focus is improved by 33%. Liquid immersion is effective for any patterns and can be combined with a phase shift mask method, a deformed illumination method, and the like.

The control performance of a stage in a liquid immersion state is changed and degraded relative to a state not having liquid immersion (hereinafter, referred to as a dry state) due to disturbances such as the surface tension, weight, and viscosity of a liquid. Hence, the alignment accuracy of the stage decreases. Such a phenomenon occurs statically and dynamically. Particularly, a step-and-scan exposure apparatus, which has become the mainstream is greatly affected by this phenomenon, because exposure is performed during driving. Moreover, in a local fill method, in which a wafer surface is partially brought to a liquid immersion state, when a shot on the outer periphery of the wafer is exposed, the wafer surface may be changed from a dry state to the liquid immersion state, and vice versa. In this case, a great disturbance is generated at the change between the liquid immersion state and the dry state.

When such a disturbance degrades the performance of the stage, it becomes impossible to obtain the greatest possible effect of liquid immersion exposure. As a matter of course, it is necessary to precisely control the vibrations, flow rate, thickness, volume, uniformity, temperature, and so on, of a liquid to solve this problem. The problem cannot be solved only by such control, and thus, measures using a stage control system are necessary.

SUMMARY OF THE INVENTION

The present invention is devised in view of the above problem. An object of the present invention is to compensate for and to reduce changes in stage control characteristics unique to a liquid immersion exposure apparatus and to improve alignment accuracy.

In order to solve the problem and to attain the object, the present invention provides a liquid immersion exposure apparatus for exposing a pattern onto a substrate through a projection lens unit while a space between the substrate and the projection lens unit is filled with a liquid, the apparatus comprising a stage which carries the substrate, means for supplying the liquid to the space between the substrate and the projection lens unit and for recovering the liquid from the space, and a controller, which controls driving of the stage, characterized in that the controller changes at least one of the control parameters of the stage and the driving profile of the stage according to a liquid immersion condition.

The present invention also provides a liquid immersion exposure apparatus for exposing a pattern onto a substrate through a projection lens unit while switching between a state in which a space between the substrate and the projection lens unit is filled with a liquid and a state in which the liquid is removed from the space, the apparatus comprising a stage which carries the substrate, means for supplying the liquid to the space between the substrate and the projection lens unit and for recovering the liquid from the space, and a controller which controls the driving of the stage, characterized in that the controller changes at least one of the control parameter of the stage and the driving profile of the stage on the basis of the presence of a liquid immersion.

The present invention further provides a liquid immersion exposure apparatus for exposing a pattern onto a substrate through a projection lens unit while a space between the substrate and the projection lens unit and the surrounding part of the substrate is filled with a liquid, the apparatus comprising a stage which carries the substrate, means for supplying the liquid to the space between the substrate and the projection lens unit and the surrounding part of the substrate, and for recovering the liquid from the space, and a controller which controls driving of the stage, characterized in that the stage is driven so as to shift from a dry state where a substrate surface is not filled with the liquid to the liquid immersion state where the substrate surface is filled with the liquid or to shift from the liquid immersion state to the dry state, the controller changes at least one of a control parameter of the stage and a driving profile of the stage between the dry state and the liquid immersion state.

The present invention further provides a liquid immersion exposure apparatus for exposing a pattern onto a substrate through a projection lens unit while a space between the substrate and the projection lens unit is filled with a liquid, the apparatus comprising a stage which carries the substrate, means for supplying the liquid to the space between the substrate and the projection lens unit and for recovering the liquid from the space, a controller which controls driving of the stage, and a plate which is disposed around the substrate, characterized in that the controller changes at least one of a control parameter of the stage and a driving profile of the stage in a case that the liquid is passed between the substrate and the plate.

Additionally, the present invention is applicable to a stage control method performed by the stage controller of the liquid immersion exposure apparatus and a device manufacturing method of manufacturing a semiconductor device using the liquid immersion exposure apparatus.

As described above, according to the present invention, the alignment accuracy of the liquid immersion projection exposure apparatus can be improved by reducing changes in the control characteristics of the stage, the changes being caused by a liquid immersion state.

Other objects and advantages besides those discussed above shall be apparent to those skilled in the art from the description of a preferred embodiment of the invention, which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

An embodiment of the present invention will be specifically described below with reference to the accompanying drawings.

The embodiment discussed below is an example of implementing means of the present invention and should be properly modified or changed according to various conditions, and the configuration of an apparatus where the present invention is applied.

Needless to say, the present invention can be achieved also by supplying, to a system or an apparatus, a storage medium (or a recording medium) for storing a program code of software for implementing a liquid immersion exposure method and a device manufacturing method, which are included in the embodiment discussed later, and by causing the computer (CPU or MPU) of the system or the apparatus to read and to execute the program code stored in the storage medium.

Figure 1:
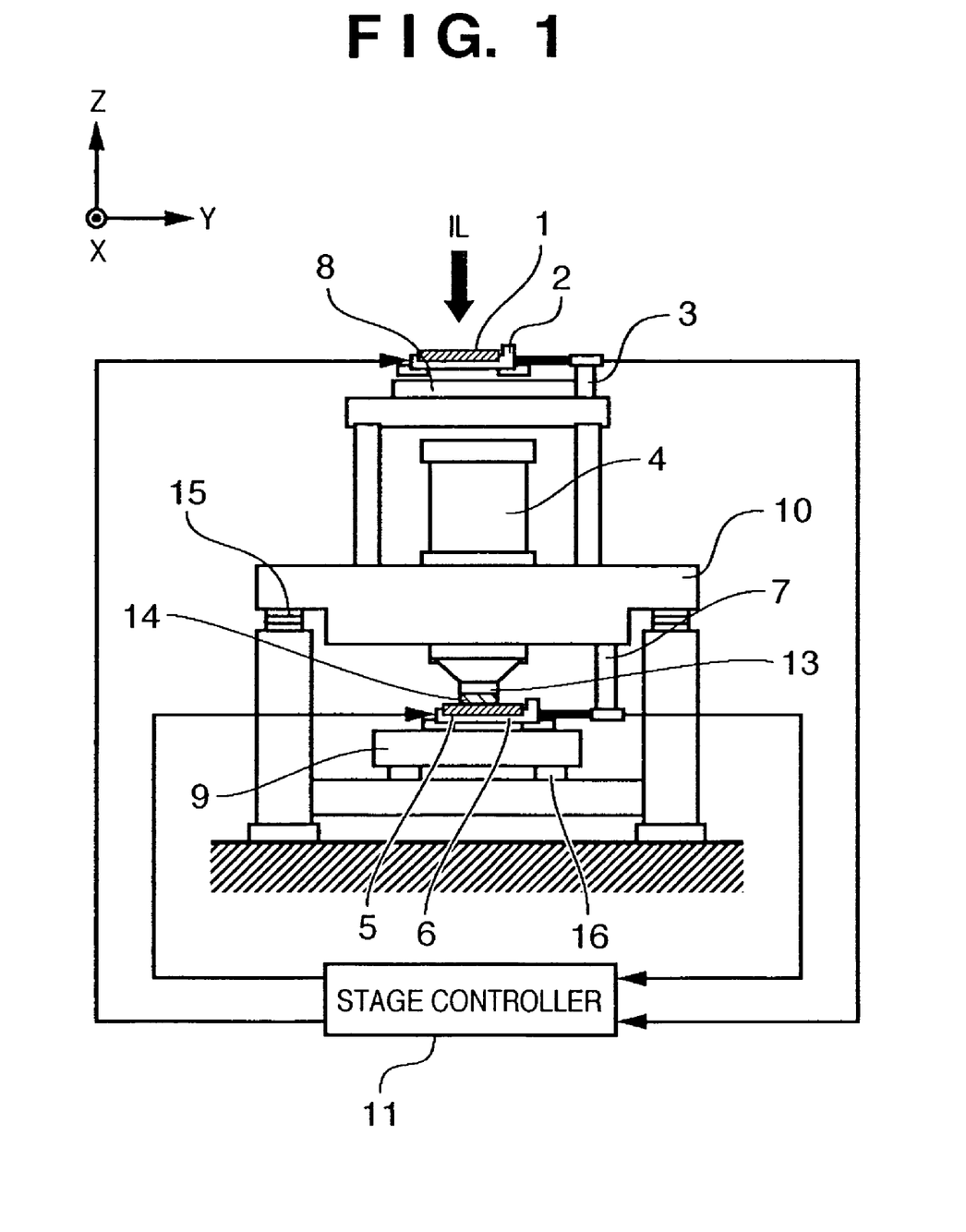
FIG. 1 is a schematic structural diagram showing a liquid immersion projection exposure apparatus according to an embodiment of the present invention.

FIG. 1 is a schematic structural diagram showing a step-and-scan liquid immersion projection exposure apparatus in which the embodiment of the present invention is applied.

In FIG. 1, a reticle 1 having a circuit pattern 1 is illuminated by slit illumination light IL having a uniform illuminance. A reticle stage 2 and a wafer stage 6 are synchronized with each other in a Y direction (the width direction of the slit) at a speed of the reduction ratio of a projection lens 4, so that the pattern of the reticle 1 is formed and projected on a wafer 5 for fabricating a semiconductor device. An interferometer 3 for the reticle stage measures a Y-direction displacement of the reticle stage 2 and transmits the displacement to a stage controller 11. Similarly, an interferometer 7 for the wafer stage measures a Y-direction displacement of the wafer stage 6 and transmits the displacement to the stage controller 11.

The stage controller 11 controls the reticle stage 2 and the wafer stage 6 separately or synchronously based on the measured values. The displacements of the reticle stage and the wafer stage are measured also in the X direction by an interferometer (not shown), and the stages are controlled by the stage controller 11. The interferometers 3 and 7, the projection lens 4, a reticle stage base 8, and a wafer stage 9 are configured on a main body structure 10, and, thus, the reticle stage 2 and the wafer stage 6 can be synchronously controlled relative to the main body structure 10.

Reference numeral 15 denotes an active mount for the main body. The active mount 15 supports the main body structure 10 to reduce vibrations and isolates vibrations from the floor. Reference numeral 16 denotes an active mount for the stage. The active mount 16 reduces vibrations caused by the movement of the wafer stage 6 and isolates vibrations from the floor.

A liquid immersion nozzle 13 is attached to the projection lens 4 and has a mechanism for supplying and recovering an immersion liquid, such as pure water. This mechanism creates a liquid immersion state 14 between the wafer 5 and the projection lens 4. In this case, the liquid immersion state may be formed not only between the wafer 5 and the projection lens 4, but also between a sensor (e.g., a stage reference mark, an uneven illuminance sensor, and the like) mounted on the wafer stage and an optical member opposed to the sensor.

Figure 2:
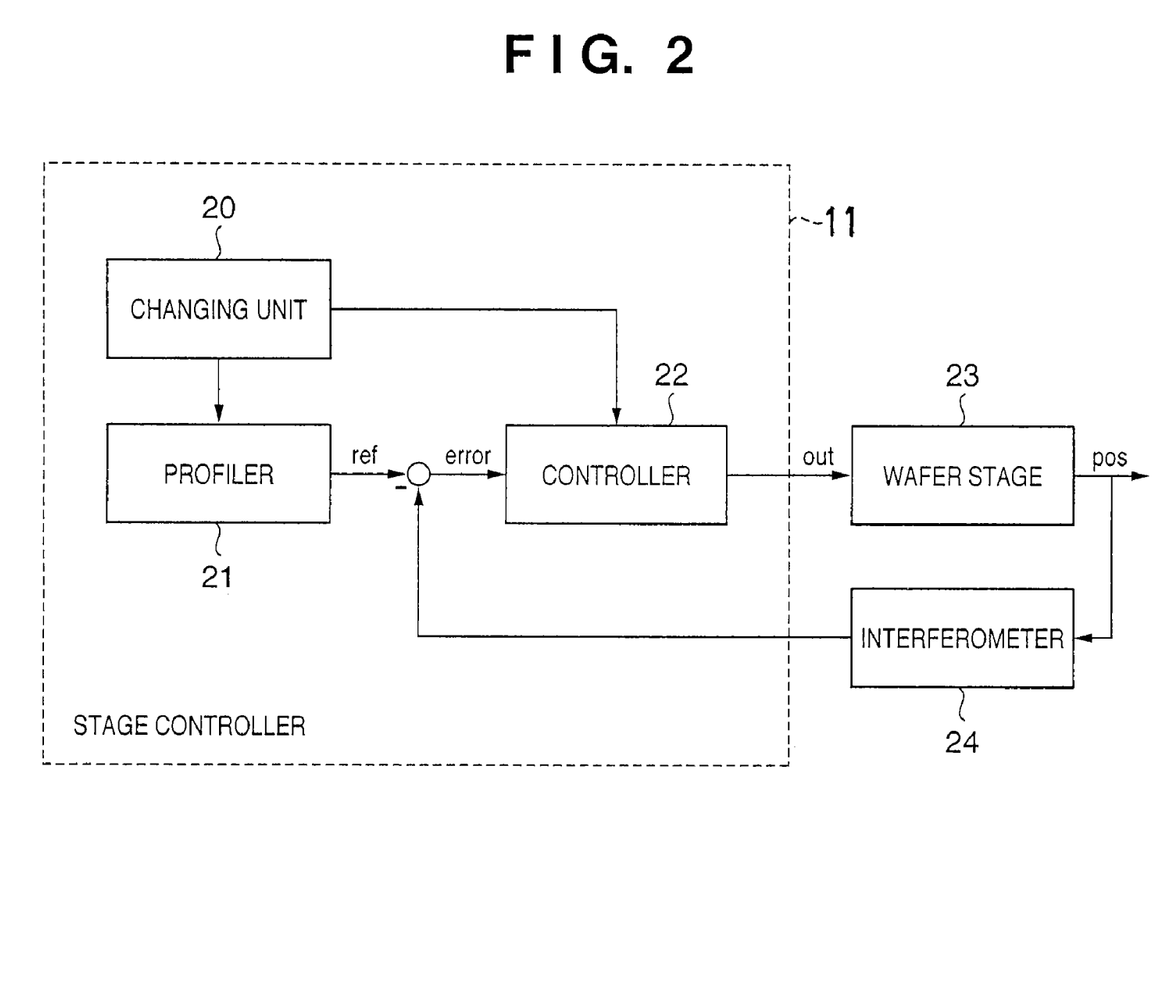
FIG. 2 is a control block diagram showing the embodiment of the present invention.

FIG. 2 is a block diagram, the most indicative of the characteristics of the present invention. A profiler 21 generates a target value (ref) of a wafer stage 23 based on a predetermined driving profile of the wafer stage. An interferometer 24 measures the current position (pos) of the wafer stage 23. When a deviation (error), which is a difference between the target value (ref) and the current position (pos) is transmitted to a controller 22, the controller 22 outputs a driving current value (control variable) based on the predetermined control parameter of the wafer stage. The outputted driving current value is transmitted through a driver to a linear motor mounted on the wafer stage to drive the wafer stage.

The driving profile of the wafer stage includes at least one of parameters of an acceleration, a speed, a Jerk time (a rate of change in acceleration), and a settling time (from the time a constant velocity section is started at the end of an acceleration section until the time exposure is started). The parameters generate the target value of the wafer stage. By changing at least one of these parameters, vibration components included in the target value generated from the start to the stop of driving are changed, affecting the alignment accuracy of the wafer stage.

On the other hand, the control parameter of the wafer stage includes at least one of a PID parameter, a low-pass filter, a notch filter, and a feedforward gain, and relates to the control characteristics of the wafer stage. This parameter determines the stability, responsiveness, robustness, and alignment accuracy of the wafer stage.

In the conventional projection exposure apparatus, the driving profile and the control parameter are both fixed values. In the present invention, the driving profile and the control parameter are variable according to liquid immersion conditions in the following manner:

(1) variable according to liquid immersion conditions, (2) variable depending on the presence or absence of a liquid immersion state for each driving, and (3) variable depending on the presence or absence of a liquid immersion state during driving. In this case, each driving indicates each scan driving or each step driving. In FIG. 2, at least one of parameters set for the profiler 21 and the controller 22 are changed by changing unit 20 having obtained information about the presence or absence of liquid immersion conditions and a liquid immersion state. The information about the presence or absence of liquid immersion conditions and a liquid immersion state may be detected by a sensor, and the like, or the information may be stored in advance.

The following will specifically describe (1) to (3).

(1)

In the absence of the liquid immersion state 14 (dry state) in FIG. 1, that is, in the conventional projection exposure apparatus, the active mount 15 for the main body and the active mount 16 for the stage isolate the main body structure from vibrations caused by the movement of the wafer stage 6. However, the presence of the liquid immersion state 14 connects the main body structure 10 and the wafer stage 6 via the liquid immersion nozzle 13, the projection lens 4, and the wafer 5, thereby creating a vibration propagation path. Since the liquid immersion state 14 has spring characteristics and viscosity, vibrations propagate from the wafer stage to the main body structure or from the main body structure to the wafer stage. Thus, the alignment accuracy of the wafer stage decreases. It is generally understood that spring characteristics and viscosity, which are factors changing the control characteristics, are changed by the thickness of a liquid in the liquid immersion state 14 (a gap between the wafer and the lens), a temperature, components, a flow rate, a volume, a contact area between the wafer and the lens, a contact angle of the immersion liquid and the wafer (an angle of a wafer surface and a tangent on an immersion liquid surface, on a contact point of the wafer surface and the immersion liquid surface formed by a surface tension), and a contact angle of the immersion liquid and the lens. Hence, in the present invention, at least one of the driving profile or the control parameter of the wafer stage is changed according to the liquid immersion conditions, so that it is possible to compensate for changes in the control characteristics in the liquid immersion state 14 and to prevent a reduction in alignment accuracy.

(2)

The liquid immersion projection exposure apparatus generates the liquid immersion state 14 and drives the wafer stage 6 during exposure. On the other hand, in a non-exposure time, during which the wafer is carried in or out, a calibration mark provided on the wafer stage 6 is measured, so that the wafer stage 6 is driven in a dry state. As described in (1), the control characteristics of the wafer stage 6 vary between the liquid immersion state 14 and the dry state. In the present invention, at least one of the driving profile and the control parameter of the wafer stage is changed between the liquid immersion state and the dry state, so that it is possible to obtain a preferred alignment accuracy both in the liquid immersion state and the dry state.

(3)

Figure 3:
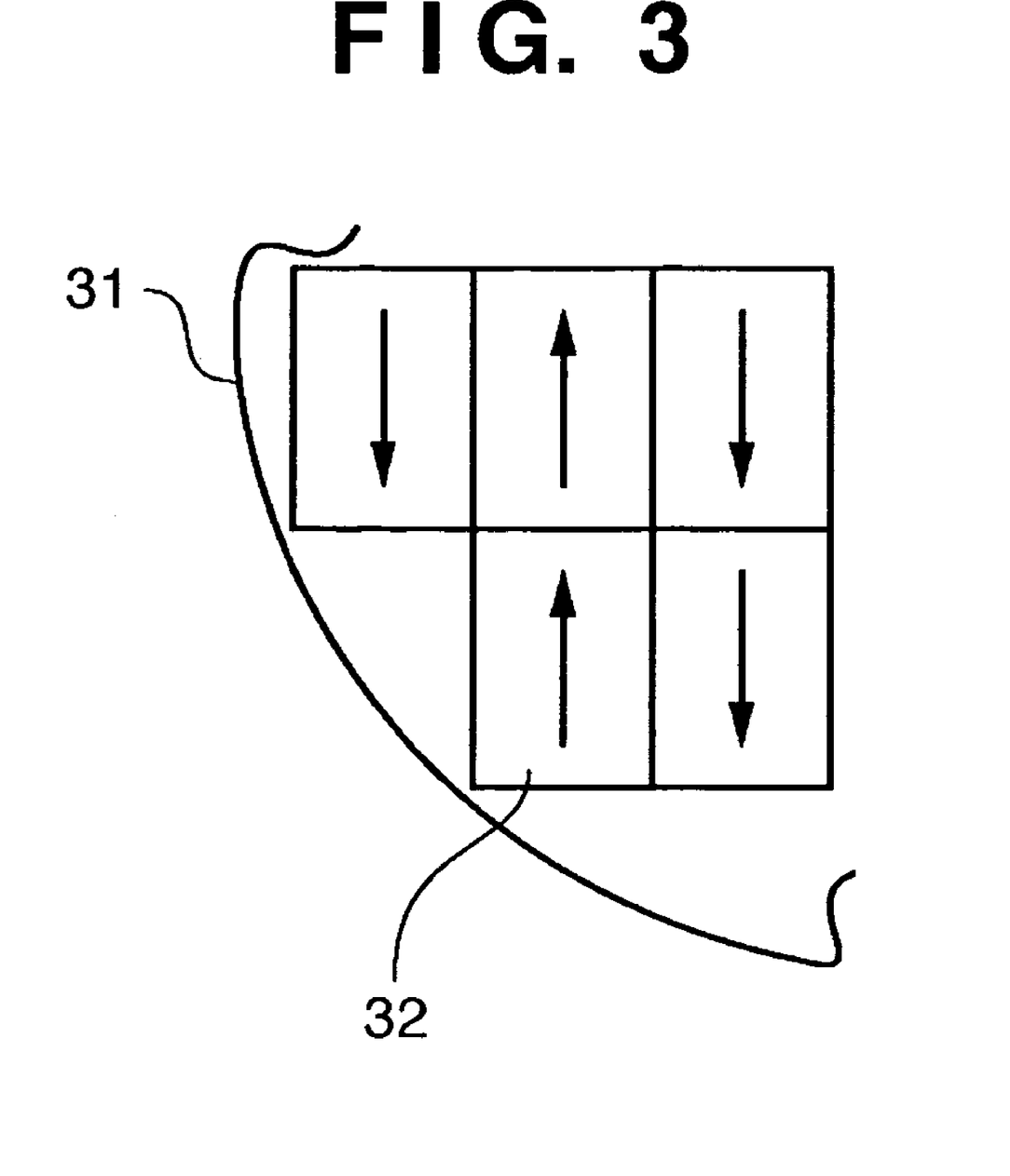
FIG. 3 is a schematic diagram showing a wafer layout according to the embodiment of the present invention.

In FIG. 3, a wafer 31 indicates a part of the wafer to be exposed. Only five shots are illustrated. Arrows in FIG. 3 indicate the exposing directions of the shots. For example, a shot 32 is exposed from the outside to the inside of the wafer. In a shot like the shot 32 disposed on the outer edge of the wafer and exposed from the outside of the wafer, a liquid immersion area moves from the outside of the wafer during exposure, which will be discussed in accordance with FIG. 4.

Figure 4:
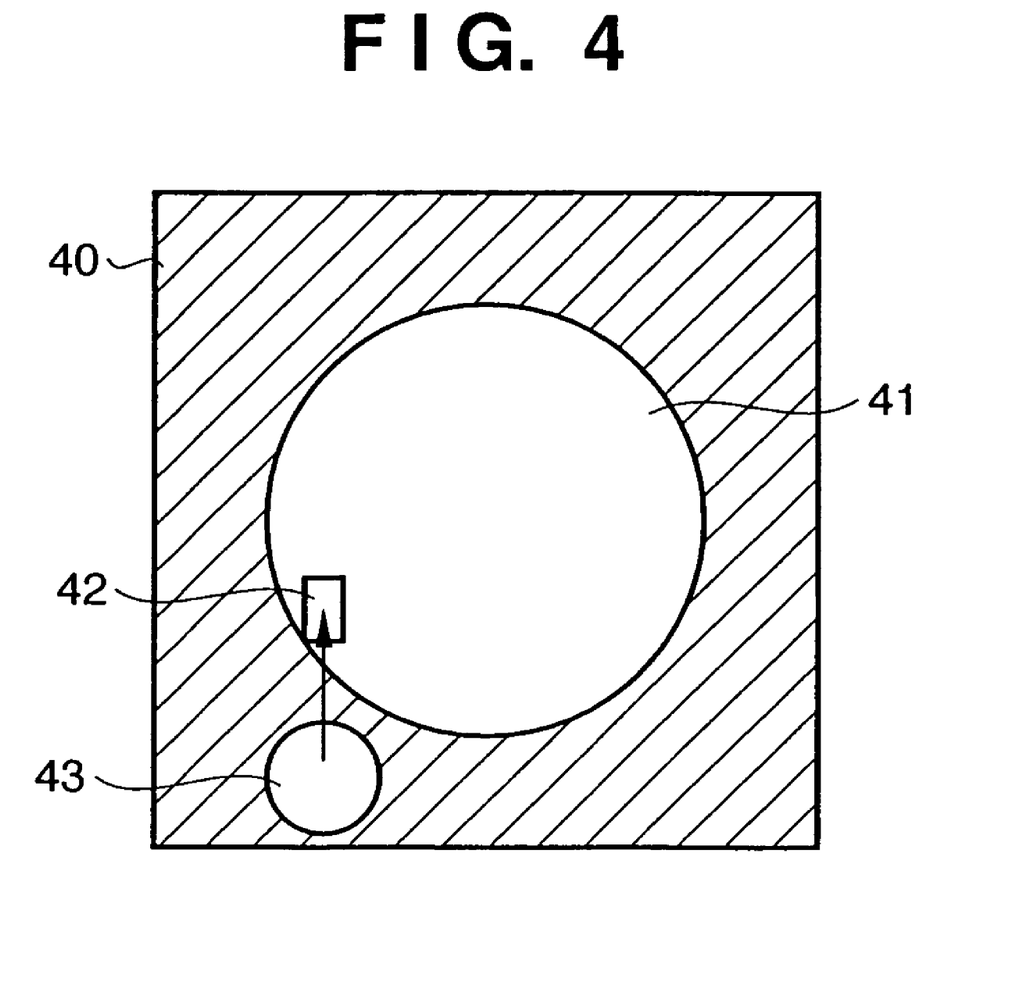
FIG. 4 is a schematic diagram showing a displacement of a liquid immersion area according to the embodiment of the present invention.

FIG. 4 is a top view of the wafer stage. Reference numeral 41 denotes the wafer and reference numeral 42 denotes a shot corresponding to the shot 32 of FIG. 3. In order to expose the shot 42, a liquid immersion area 43 has to move from the outside to the inside of the wafer 41 (actually, the liquid immersion area 43 does not move and the wafer stage is driven). In order to create a liquid immersion state also outside the wafer, a same surface plate 40 is provided, which makes contact with the outer periphery of the wafer 41 and is equal in height to the wafer 41. The same surface plate 40 makes it possible to expose the shot 42 on the outer edge of the wafer. However, between the same surface plate 40 and the wafer 41, there are provided:

a gap on the order of a micron;

a height difference (step height) on the order of a micron; and a difference in friction force, and the like, due to a difference in hydrophilicity and hydrophobicity.

Thus, when the liquid immersion area 43 is displaced from the same surface plate 40 to the wafer 41, the control characteristics of the wafer stage are changed. In the present embodiment, when the liquid immersion area 43 is displaced from the same surface plate 40 (in other words, the wafer 41 is in a dry state) to the wafer 41 (in other words, the wafer 41 is in a liquid immersion state), driving is performed while the driving profile or the control parameter of the wafer stage is switched, thereby reducing changes in control characteristics during the transition from the dry state to the liquid immersion state.

The present embodiment is applicable also when the liquid immersion area moves from the inside to the outside of the wafer, that is, when a displacement is made from the liquid immersion state to the dry state.

Figure 5:
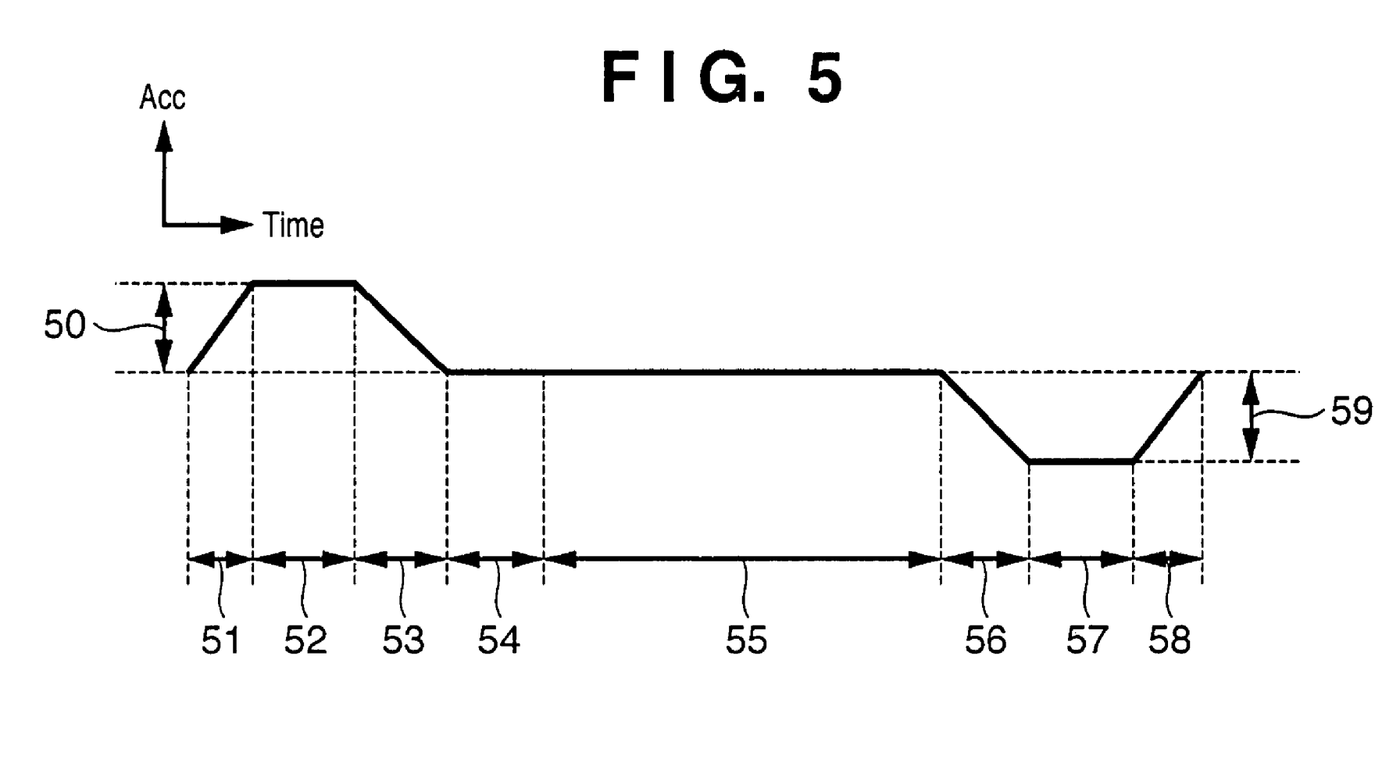
FIG. 5 is a schematic diagram showing a target acceleration of a stage according to the embodiment of the present invention.

The following will discuss a method of changing the driving profile. FIG. 5 is a schematic diagram showing an example of a target acceleration during the scanning of the wafer stage. In the profiler 21 of FIG. 2, a position target value obtained by integrating the target acceleration in two stages is generated and outputted. In FIG. 5, the abscissa represents time and the ordinate represents an acceleration. Reference numeral 50 denotes the maximum acceleration at the start of driving, and reference numeral 59 denotes the maximum acceleration (negative value) during stop. Reference numerals 51, 53, 56, and 56 denote Jerk times for determining a rate of change in acceleration. Reference numerals 52 and 57 denote time periods during which the maximum acceleration is kept. Reference numeral 54 denotes a settling time from the time the wafer stage reaches the maximum speed after 51→52→53 until the time the wafer stage converges to a desired alignment accuracy, that is, an accuracy of synchronization with the reticle stage. After the settling time 54, the wafer stage enters exposure time 55 and exposure is performed. After 56→57→58, driving is completed. FIG. 5 shows the target acceleration during scanning. In the case of stepping, the settling time 54 is absent and the exposure time 55 is simply changed to a constant speed time.

In the liquid immersion state, the immersion liquid degrades the convergence of the wafer stage. A degradation in accuracy of synchronization can be prevented by making the settling time 54 linger than that of the dry state. However, the longer settling time 54 causes a lower throughput. In many cases, a convergence waveform degraded in the liquid immersion state includes a specific frequency component f1 [Hz]. A force generated by the wafer stage is applied to the immersion liquid. The force is proportional to the acceleration, and, thus, 50, 51, 52, and 53 are selected so that the acceleration waveform of 51→52→53 does not include f1. Hence, it is possible to prevent a degradation in accuracy of synchronization without increasing the settling time 54.

When the immersion liquid supplied by the liquid immersion nozzle 13 increases in flow rate and flow velocity, disturbances caused by a pressure or a pulsation to the wafer stage increase, thereby reducing the alignment accuracy of the stage. Also, in this case, degradation in alignment accuracy can be prevented by changing the target acceleration of FIG. 5.

In the liquid immersion state, the spring characteristic and viscosity of the immersion liquid increase and the alignment accuracy of the stage decreases in the following cases:

(i) a contact area (liquid immersion radius) of the wafer and the lens increases, (ii) a contact angle of the immersion liquid and the wafer or the immersion liquid and the lens decreases, and (iii) the thickness of the immersion liquid, that is, a distance between the wafer and the lens decreases. Thus, a degradation in alignment accuracy can be prevented by changing the target acceleration of FIG. 5 according to the contact area, the contact angle, and the liquid thickness.

The following will discuss a method of changing the control parameter of the stage. In the liquid immersion state, the frequency characteristics of the wafer stage are changed by the influence of the immersion liquid. For example, the spring characteristic reduces a gain at 10 Hz or lower, resulting in a degradation in tracking property at a low frequency. The controller 22 of FIG. 2 includes a PID parameter below:

$$PID(s)=Kp(1+fi/s+s/fd)$$

where Kp represents a proportional gain, fi represents an integral frequency, fd represents a differential frequency, and s represents a Laplace operator. By increasing the proportional gain Kp or the integral frequency fd, it is possible to compensate for a reduced gain at a low frequency and a degradation in tracking property. Since the adverse effect of the spring characteristic increases in (i) to (iii), it is preferable to increase the proportional gain or the integral frequency according to the contact area, the contact angle, and the liquid thickness. Further, it is effective to change the PID parameter for each driving depending on the presence or absence of the liquid immersion state. It is also effective to change the PID parameter during driving on a shot, which is changed from the dry state to the liquid immersion state, and vice versa.

The driving profile and the control parameter may be stored in the stage controller as a table corresponding to the X and Y coordinates of the wafer stage and switched therein. Moreover, a greater effect can be obtained by adding learning based on actual exposure results and updating the table.

Figure 6:
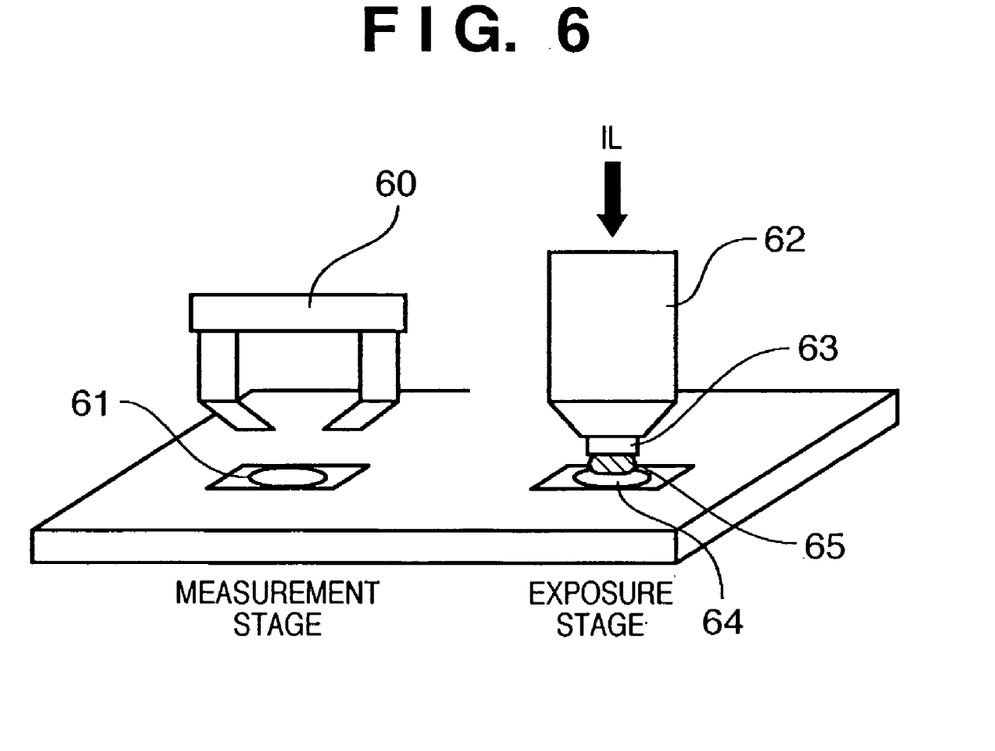
FIG. 6 is a conceptual diagram showing a twin-stage projection exposure apparatus according to another embodiment of the present invention.

The following will describe an application example of a twin-stage projection exposure apparatus having two wafer stages of a measurement stage and an exposure stage. FIG. 6 is a conceptual diagram showing the twin-stage system. The function of the twin stage is well known and, thus, the detailed explanation thereof is omitted. A measurement unit 60 measures alignment and focus/leveling of a wafer (not shown) on a stage 61 being located below an alignment measurement means 60. A wafer (not shown) mounted on a stage 64 being located below a projection lens 62 is exposed to illumination light IL through a projection lens 62. At this point, a liquid immersion nozzle 63 generates a liquid immersion state 65 and driving is performed. These two stages can be switched with each other, thereby, exposure and alignment processes are performed simultaneously. In this case, the stage below the alignment measurement means is mainly in a dry state; whereas, the stage below the projection lens 62 is mainly in the liquid immersion state. Thus, a degradation in alignment accuracy in the liquid immersion state can be prevented by changing at least one of a driving profile and a control parameter for each stage position. As a matter of course, also, in a projection exposure apparatus having two or more wafer stages, e.g., three or four wafer stages, at least one of a driving profile and a control parameter can be changed for each stage.

The foregoing embodiment is also applicable to a step-and-repeat liquid immersion projection exposure apparatus. Moreover, the embodiment is applicable to a reticle stage. The present embodiment illustrates the position control system. The embodiment is also applicable to a speed control system.

[Device Manufacturing Method]

The following will describe an embodiment of a device manufacturing method using the foregoing exposure apparatus.

Figure 7:
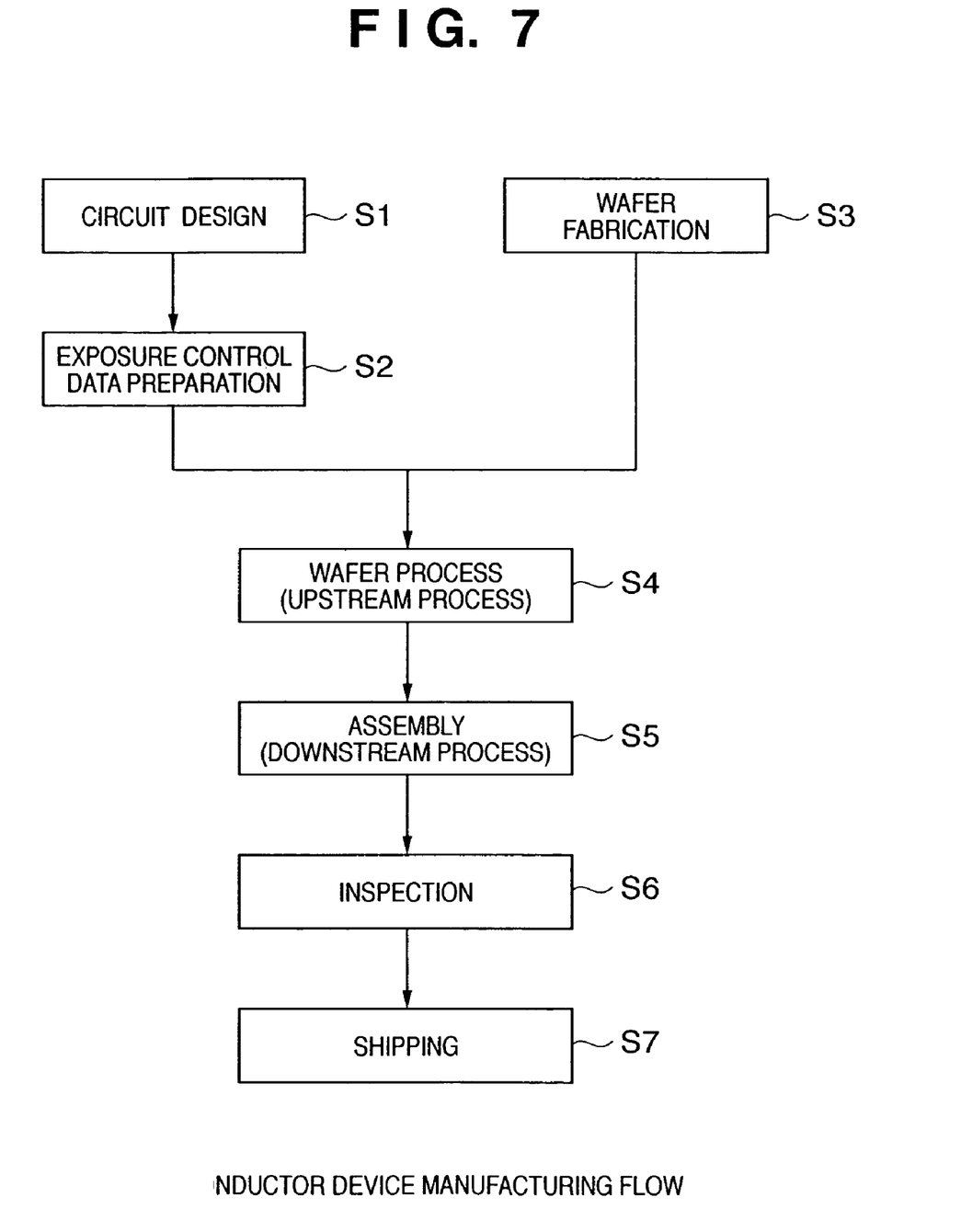
FIG. 7 is a diagram for explaining a flow of manufacturing a micro device.

FIG. 7 shows a flow of manufacturing a micro device (including a semiconductor chip, such as an IC and an LSI, a liquid crystal panel, a CCD, a thin-film magnetic head, and a micromachine). In step S1 (circuit design), the circuit of a semiconductor device is designed. In step S2 (exposure control data preparation), the exposure control data of the exposure apparatus is prepared based on a designed circuit pattern. Meanwhile, in step S3 (wafer fabrication), a wafer is fabricated using a material such as silicon. Step S4 (wafer process) is called an upstream process, in which a circuit is actually formed on the wafer according to lithography using the wafer and the exposure apparatus to which the prepared exposure control data is inputted. The next step, step S5 (assembly) is called a downstream process, in which a semiconductor chip is formed using the wafer having been fabricated in step S4. The downstream process includes an assembling process (dicing, bonding) and a packaging process (chip sealing). In step S6 (inspection), a semiconductor device having been fabricated in step S5 is tested to confirm its operations and durability. After these processes, the semiconductor device is completed and shipped (step S7).

Figure 8:
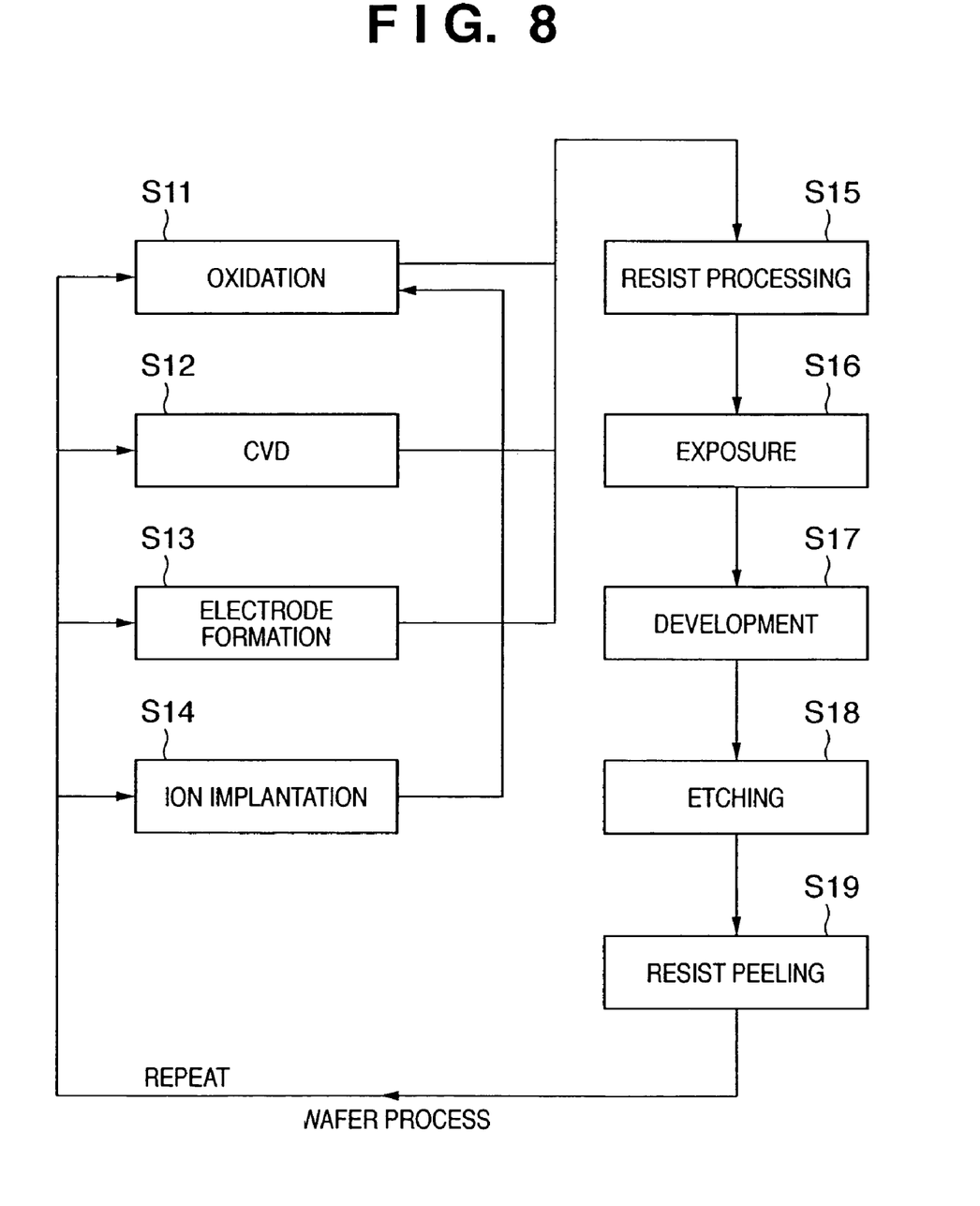
FIG. 8 is a diagram for explaining a wafer process.

FIG. 8 shows the detailed flow of the wafer process. In step S11 (oxidation), a wafer surface is oxidized. In step S12 (CVD), an insulating film is formed on the wafer surface. In step S13 (electrode formation), an electrode is formed on the wafer by deposition. In step S14 (ion implantation), ions are implanted into the wafer. In step S15 (resist processing), a sensitizer is applied to the wafer. In step S16 (exposure), a circuit pattern is baked and exposed onto the wafer by the above-described exposure apparatus. In step S17 (development), the exposed wafer is developed. In step S18 (etching), a part other than a developed resist image is etched away. In step S19 (resist peeling), a resist is removed which has become unnecessary after etching. By repeating these steps, multiple circuit patterns are formed on the wafer.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application No. 2004-229812, filed on Aug. 5, 2004, the entire contents of which are hereby incorporated by reference herein.

What is claimed is:

1. A liquid immersion exposure apparatus for exposing a pattern onto a substrate while a space between the substrate and a projection lens unit, which projects the pattern onto the substrate, is filled with a liquid, said apparatus comprising:
   a stage which carries the substrate;
   a unit which supplies the liquid to the space between the substrate and the projection lens unit and recovers the liquid from the space; and
   a controller which controls driving of the stage on the basis of a driving profile representing a target driving value according to an elapsed time from a start to a stop of driving the stage in a direction perpendicular to an optical axis of the projection lens unit,
   wherein the controller uses a different driving profile on the basis of the presence or absence of a liquid immersion condition, so that an acceleration waveform of the stage corresponding to the driving profile does not include a predetermined specific frequency component that deteriorates a convergence waveform of the stage.

2. The liquid immersion exposure apparatus according to claim 1, wherein the driving profile of the stage includes at least one of an acceleration, a speed, a Jerk time, and a settling time of the stage.

3. The liquid immersion exposure apparatus according to claim 1, wherein the liquid immersion condition includes at least one of a liquid thickness, a liquid temperature, a liquid type, a liquid flow rate, a liquid volume, and a liquid flow velocity in the liquid immersion state.

4. A liquid immersion exposure apparatus for exposing a pattern onto a substrate while a space between the substrate and a projection lens unit, which projects the pattern onto the substrate, is filled with a liquid, said apparatus comprising:
   a stage which carries the substrate;
   a unit which supplies the liquid to the space between the substrate and the projection lens unit and recovers the liquid from the space; and
   a controller which controls driving of the stage on the basis of a driving profile representing a target driving value according to an elapsed time from a start to a stop of driving the stage in a direction perpendicular to an optical axis of the projection lens unit,
   wherein the controller uses a different driving profile on the basis of the presence or absence of a liquid immersion condition in the space between the substrate and the projection lens unit, so that an acceleration waveform of the stage corresponding to the driving profile does not include a predetermined specific frequency component that deteriorates a convergence waveform of the stage.

5. The liquid immersion exposure apparatus according to claim 4, wherein the driving profile of the stage includes at least one of an acceleration, a speed, a Jerk time, and a settling time of the stage.

6. A liquid immersion exposure apparatus for exposing a pattern onto a substrate while a space between the substrate and a projection lens unit, which projects the pattern onto the substrate, is filled with a liquid, said apparatus comprising:
   a stage which carries the substrate;
   a unit which supplies the liquid to the space between the substrate and the projection lens unit and recovers the liquid from the space;
   a controller which controls driving of the stage in a direction perpendicular to an optical axis direction of the projection lens unit; and
   a plate which is fixed to the stage and disposed around the substrate,
   wherein the controller changes a control parameter of the stage so as to reduce changes in control characteristics of the stage in the direction perpendicular to the optical axis of the projection lens unit, the changes occurring when the liquid contacts the boundary with the substrate and the plate when the stage is moving.

7. The liquid immersion exposure apparatus according to claim 6, wherein the control parameter of the stage includes at least one of a PID parameter, a feed forward gain, and a filter parameter.

8. A method of controlling a liquid immersion exposure apparatus for exposing a pattern onto a substrate while a space between the substrate and a projection lens unit is filled with a liquid, the apparatus comprising a stage which carries the substrate, and a controller which controls driving of the stage on the basis of a driving profile representing a target driving value according to an elapsed time from a start to a stop of driving the stage in a direction perpendicular to an optical axis of the projection lens unit, the apparatus exposing the pattern onto the substrate through the projection lens unit while the space between the substrate and the projection lens unit is filled with the liquid, the method comprising the step of:
   using a different driving profile on the basis of the presence or absence of a liquid immersion condition, so that an acceleration waveform of the stage corresponding to the driving profile does not include a predetermined specific frequency component that deteriorates a convergence waveform of the stage.

9. A method of controlling a liquid immersion exposure apparatus for exposing a pattern onto a substrate while a space between the substrate and a projection lens unit is filled with a liquid, the apparatus comprising a stage which carries the substrate, and a controller which controls driving of the stage on the basis of a driving profile representing a target driving value according to an elapsed time from a start to a stop of driving the stage in a direction perpendicular to an optical axis of the projection lens unit, the apparatus exposing the pattern onto the substrate through the projection lens unit while switching between a state in which the space between the substrate and the projection lens unit is filled with the liquid and a state in which the liquid is removed from the space, the method comprising the step of:
   using a different driving profile on the basis of the presence or absence of a liquid immersion condition, so that an acceleration waveform of the stage corresponding to the driving profile does not include a predetermined specific frequency component that deteriorates a convergence waveform of the stage.

10. A method of controlling a liquid immersion exposure apparatus for exposing a pattern onto a substrate while a space between the substrate and a projection lens unit is filled with a liquid, the apparatus comprising a stage which carries the substrate, a unit that supplies the liquid to the space between the substrate and the projection lens unit and recovers the liquid from the space, a controller which controls driving of the stage in a direction perpendicular to an optical axis of the projection lens unit, and a plate which is fixed to the stage and disposed around the substrate, the apparatus exposing the pattern onto the substrate through the projection lens unit while the space between the substrate and the projection lens unit is filled with the liquid, the method comprising the step of:

changing a control parameter of the stage and so as to reduce changes in control characteristics of the stage in the direction perpendicular to the optical axis of the projection lens unit, the changes occurring when the liquid contacts the boundary with the substrate and the plate when the stage is moving.

11. A device manufacturing method comprising the steps of:
(a) exposing a pattern using an exposure apparatus, which includes a liquid immersion exposure apparatus for exposing the pattern onto a substrate while a space between the substrate and a projection lens unit, which projects the pattern onto the substrate, is filled with a liquid, the apparatus comprising:
(i) a stage which carries the substrate;
(ii) a unit which supplies the liquid to the space between the substrate and the projection lens unit and recovers the liquid from the space; and
(iii) a controller which controls driving of the stage on the basis of a driving profile representing a target driving value according to an elapsed time from a start to a stop of driving the stage in a direction perpendicular to an optical axis of the projection lens unit,
wherein the controller uses a different driving profile on the basis of the presence or absence of a liquid immersion condition, so that an acceleration waveform of the stage corresponding to the driving profile does not include a predetermined specific frequency component that deteriorates a convergence waveform of the stage; and
(b) developing the exposed pattern.

12. A device manufacturing method comprising the steps of:
(a) exposing a pattern using an exposure apparatus, which includes a liquid immersion exposure apparatus for exposing the pattern onto a substrate while a space between the substrate and a projection lens unit, which projects the pattern onto the substrate, is filled with a liquid, the apparatus comprising:
(i) a stage which carries the substrate;
(ii) a unit which supplies the liquid to the space between the substrate and the projection lens unit and recovers the liquid from the space; and
(iii) a controller which controls driving of the stage on the basis of a driving profile representing a target driving value according to an elapsed time from a start to a stop of driving the stage in a direction perpendicular to an optical axis of the projection lens unit,
wherein the controller uses a different driving profile on the basis of the presence or absence of a liquid immersion condition in the space between the substrate and the projection lens unit, so that an acceleration waveform of the stage corresponding to the driving profile does not include a predetermined specific frequency component that deteriorates a convergence waveform of the stage; and
(b) developing the exposed pattern.

13. A device manufacturing method comprising the steps of:
(a) exposing a pattern using an exposure apparatus, which includes a liquid immersion exposure apparatus for exposing the pattern onto a substrate while a space between the substrate and a projection lens unit, which projects the pattern onto the substrate, is filled with a liquid, the apparatus comprising:
(i) a stage which carries the substrate;
(ii) a unit which supplies liquid to a space between the substrate and the projection lens unit and recovers the liquid from the space;
(iii) a controller which controls driving of the stage in a direction perpendicular to an optical axis direction of the projection lens unit; and
(iv) a plate which is fixed to the stage and is disposed around the substrate,
wherein the controller changes a control parameter of the stage so as to reduce changes in control characteristics of the stage in the direction perpendicular to the optical axis of the projection lens unit, the changes occurring when the liquid contacts the boundary with the substrate and the plate when the stage is moving; and
(b) developing the exposed pattern.

14. A liquid immersion exposure apparatus for exposing a pattern onto a substrate while a space between the substrate and a projection lens unit, which projects the pattern onto the substrate, is filled with a liquid, said apparatus comprising:
a stage which carries the substrate;
a unit which supplies the liquid to the space between the substrate and the projection lens unit and recovers the liquid from the space; and
a controller which controls driving of the stage in a direction perpendicular to an optical axis of the projection lens unit,
wherein the controller changes, on the basis of a liquid immersion condition, a control parameter of the stage in the direction perpendicular to the optical axis of the projection lens unit, the control parameter including at least one of a PID parameter, a feed forward gain, and a filter parameter, so as to prevent changes in frequency characteristics caused by the liquid.

15. The liquid immersion exposure apparatus according to claim 14, wherein the liquid immersion condition includes at least one of a liquid thickness, a liquid temperature, a liquid type, a liquid flow rate, a liquid volume, and a liquid flow velocity.

16. A liquid immersion exposure apparatus for exposing a pattern onto a substrate while a space between the substrate and a projection lens unit, which projects the pattern onto the substrate, is filled with a liquid, said apparatus comprising:
a stage which carries the substrate;
a unit which supplies the liquid to the space between the substrate and the projection lens unit and recovers the liquid from the space; and
a controller which controls driving of the stage in a direction perpendicular to the optical axis of the projection lens unit,
wherein the controller changes a control parameter of the stage in the direction perpendicular to the optical axis of the projection lens unit, the control parameter including at least one of a PID parameter, a feed forward gain, and a filter parameter, so as to prevent changes in frequency characteristics caused by the liquid, on the basis of the presence or absence of a liquid immersion condition.

* * * * *